(12) United States Patent
Torok et al.

(10) Patent No.: US 6,594,175 B2
(45) Date of Patent: *Jul. 15, 2003

(54) HIGH DENSITY GIANT MAGNETORESISTIVE MEMORY CELL

(75) Inventors: E. James Torok, Shoreview, MN (US); Richard Spitzer, Berkeley, CA (US)

(73) Assignee: Integrated Magnetoelectronics Corp, Berkeley, CA (US)

( * ) Notice: Subject to any disclaimer, the term of this patent is extended or adjusted under 35 U.S.C. 154(b) by 151 days.

This patent is subject to a terminal disclaimer.

(21) Appl. No.: 09/883,672

(22) Filed: Jun. 18, 2001

(65) Prior Publication Data

US 2002/0009840 A1 Jan. 24, 2002

Related U.S. Application Data

(60) Provisional application No. 60/217,339, filed on Jul. 11, 2000.

(51) Int. Cl.[7] .............................................. G11C 11/15
(52) U.S. Cl. ........................ 365/171; 365/158; 365/173
(58) Field of Search ................................ 365/171, 173, 365/158

(56) References Cited

U.S. PATENT DOCUMENTS

| | | | |
|---|---|---|---|
| 3,972,786 A | 8/1976 | Ballard | 204/32 R |
| 4,751,677 A | 6/1988 | Daughton et al. | 365/158 |
| 5,173,873 A | 12/1992 | Wu et al. | 365/173 |
| 5,565,236 A | 10/1996 | Gambino et al. | 427/130 |
| 5,585,986 A | 12/1996 | Parkin | 360/113 |
| 5,587,943 A * | 12/1996 | Torok et al. | 365/158 |
| 5,640,343 A | 6/1997 | Gallagher et al. | 365/171 |
| 5,640,754 A | 6/1997 | Lazzari et al. | 29/603.14 |
| 5,650,889 A | 7/1997 | Yamamoto et al. | 360/97.01 |
| 5,650,958 A | 7/1997 | Gallagher et al. | 365/173 |
| 5,652,445 A | 7/1997 | Johnson | 257/295 |
| 5,654,566 A | 8/1997 | Johnson | 257/295 |
| 5,793,697 A | 8/1998 | Scheuerlein | 365/230.07 |
| 5,852,574 A | 12/1998 | Naji | 365/158 |
| 5,892,708 A * | 4/1999 | Pohm | 365/158 |
| 5,969,978 A | 10/1999 | Prinz | 365/98 |
| 5,989,406 A * | 11/1999 | Beetz et al. | 205/118 |
| 6,134,138 A | 10/2000 | Lu et al. | 365/158 |
| 6,166,944 A | 12/2000 | Ogino | 365/97 |
| 6,483,740 B1 * | 11/2002 | Spitzer et al. | 365/158 |
| 2002/0024842 A1 * | 2/2002 | Spitzer et al. | 365/173 |

FOREIGN PATENT DOCUMENTS

JP 405266426 A * 10/1993 ............ G11B/5/31

OTHER PUBLICATIONS

Jaquelin K. Spong, et al., "Giant Magnetoresistive Spin Valve Bridge Sensor", Mar. 1996, *IEEE Transactions on Magnetics*, vol. 32, No. 2, pp. 366–371.

Mark Johnson, "*The All–Metal Spin Transistor*", May 1994, *IEEE Spectrum*, pp. 47–51.

Mark Johnson, "*Bipolar Spin Switch*", Apr. 16, 1996, *Science*, vol. 260, pp. 320–323.

(List continued on next page.)

*Primary Examiner*—Viet Q. Nguyen
(74) *Attorney, Agent, or Firm*—Beyer Weaver & Thomas LLP (57) ABSTRACT

A multi-layered memory cell is described having a plurality of magnetic layers, each of the magnetic layers being for magnetically storing one bit of information. A plurality of access lines are integrated with the plurality of magnetic layers and configured such that the bits of information stored in each of selected ones of the magnetic layers may be independently accessed using selected ones of the plurality of access lines and the giant magnetoresistive effect. The memory cell further includes at least one keeper layer. The magnetic layers, the access lines, and the at least one keeper layer form a substantially closed flux structure.

44 Claims, 7 Drawing Sheets

OTHER PUBLICATIONS

J.M. Daughton, *"Magnetoresistive Memory Technology,"* Jul. 28–Aug. 2, 1991, *Int'l Workshop on Science and Technology of Thin Films for the 21$^{st}$ Century*, vol. 216, pp. 162–168.

K.T.M. Ranmuthu et al., *"New Low Current Memory Modes with Giant Magneto–Resistance Materials,"* Apr. 13, 1993, *Digests of International Magnetics Conference*, 2 pages.

J.L. Brown, *"1—Mb Memory Chip Using Giant Magnetoresistive Memory Cells,"* Sep. 1994, *IEEE Transactions on Components, Packaging, and Manufacturing Technology*, Part A, vol. 17, No. 3, pp. 373–379.

Paul a. Packan, *"Pushing The Limits"*, Sep. 24, 1999, science Mag, vol. 285, pp. 2079–2081.

Lenssen, et al, *"Expectations of MRAM in Comparison With Other Non–Volatile Memory Technologies"*, Phillips Research Laboratories, pp. 26–30.

\* cited by examiner

HIGH DENSITY GIANT MAGNETORESISTIVE MEMORY CELL

RELATED APPLICATION DATA

The present application claims priority from U.S. Provisional Patent Application No. 60/217,339 for STACKED MULTILEVEL NONVOLATILE VLSI MAGNETIC RAM filed on Jul. 11, 2000, the entire disclosure of which is incorporated herein by reference for all purposes.

BACKGROUND OF THE INVENTION

The present invention relates to memory technology and specifically to memories which employ giant magnetoresistance to access magnetically stored information.

Semiconductor random access memory (RAM) is well known to those of skill in the art. RAM generally comprises a set of memory cells integrated on a chip with a number of peripheral circuits. RAMs are described in, for example, Porat et al., *Introduction to Digital Techniques,* John Wiley, 1979, the entirety of which is incorporated herein by reference for all purposes. In general, RAM circuits perform several functions, including addressing (selection of specific locations for access), providing power, fanout (transmission of a signal to a multiplicity of loads), and conditioning required to generate a useable output signal. In RAM memories, the addressing scheme permits random access to the desired cell, with access time being independent of the cell location. Selected portions are then extracted for use. RAMs are generally fast enough to be compatible with a CPU, but they are generally too expensive to be used for mass storage. Further, both static RAMs (SRAMs) and dynamic RAMs (DRAMs) are volatile in the sense that their contents are lost when the power to the memory is lost. DRAMs also require periodic refreshing. It is not practical, therefore, to use either DRAMs or SRAMs for long-term storage.

Electronically programmable read only memory (EPROM) and read only memory (ROM) are nonvolatile alternatives to RAM. However, while such memories do not require a refresh cycle, they have the obvious disadvantage of being programmable only once. Other nonvolatile semiconductor memories that can be written repeatedly, such as electrically alterable read only memory (EAROM) or electrically erasable read only memory (EEROM), or FLASH (an application-optimized EPROM), do not provide nearly the reliability of magnetic memories for long-term storage.

Semiconductor memory technologies are rapidly approaching fundamental limits in their further advances. The technical difficulties facing the semiconductor memory industry are well summarized in Paul Packan's paper *Pushing the Limits, Science,* Sep. 24, 1999, p. 2079, the entirety of which is incorporated herein by reference for all purposes.

In view of the foregoing disadvantages of traditional memories, developers of memory technology are increasingly looking toward alternatives such as magnetoresistance and giant magnetoresistance (GMR) as the bases for an entirely new paradigm in information storage. GMR refers to the difference in the resistance that conduction electrons experience in passage through magnetic multi-layer films (comprising alternating magnetic and nonmagnetic metal layers) depending on the relative orientation of the magnetization M in successive magnetic layers. Some of the magnetic layers may be used for storage, some for readout, some for both storage and readout, and others as keepers. In fact, even the readout layers may store information briefly for part of a read-cycle time. To distinguish the keeper from those layers that store information, whether for only part of a cycle or after completion of a cycle, we shall hereinafter refer to all but the keeper (and insulator) layers as "storage layers."

GMR in magnetic films arises from an energy gap between conduction electrons whose spin is parallel to a magnetization vector and those whose spin is anti-parallel to the magnetization vector. The larger the magnetization, the larger the giant magnetoresistance. Examples of memory technology based on GMR are described in U.S. Pat. No. 5,587,943 for NONVOLATILE MAGNETORESISTIVE MEMORY WITH FULLY CLOSED FLUX OPERATION issued on Dec. 24, 1996, the entire disclosure of which is incorporated herein by reference for all purposes. An example of the operation of a memory cell based on such techniques will now be described with reference to FIG. 1.

Figure 1:
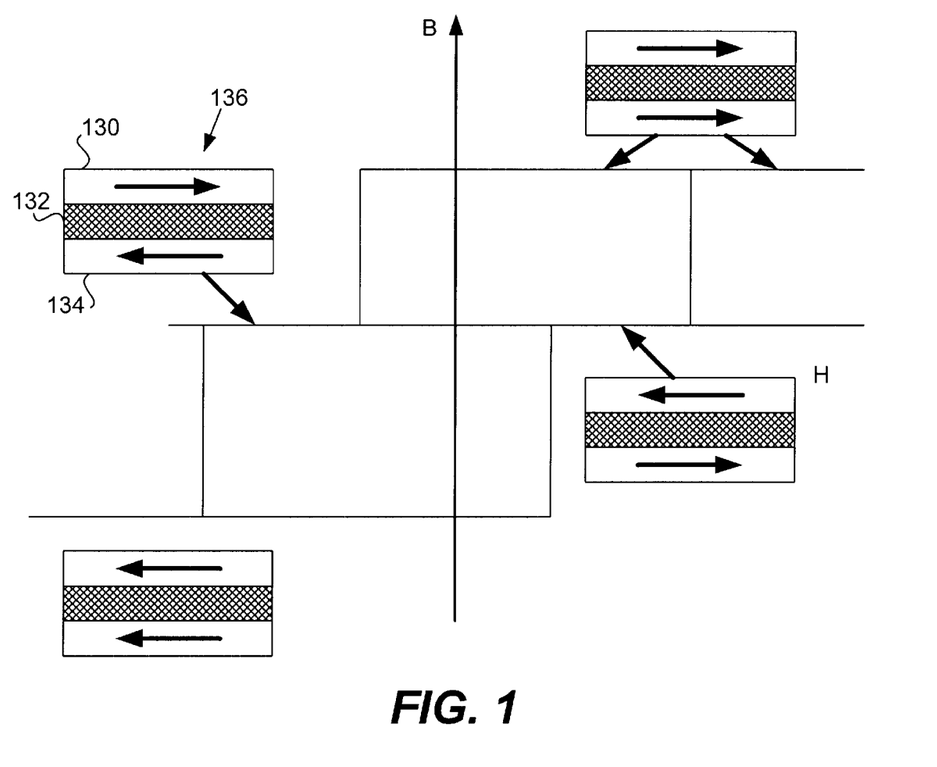
FIGS. 1 and 2 show the operation of a GMR memory cell.

FIG. 1 shows the major hysteresis loop of a GMR exchange-coupled triple-layer film. Two magnetic layers 130 and 134 are separated by a nonmagnetic layer 132. The two magnetic layers have coercivities $H_c$ that differ by more than the exchange coupling between them such that layer 130 has a high coercivity and layer 134 has a low coercivity. Film cross sections 136 show the magnetization at each part of the loop.

Beginning at the upper right quadrant, both top and bottom layers 130 and 134 are saturated in the same direction. If the applied field H is reduced to substantially zero and then reversed in direction, the layer having the lower coercivity switches first, as shown by the cross section in the upper left quadrant. The switching occurs when the field is equal to the sum of the coercivity of the lower coercivity layer plus the coupling field.

As the applied field H is increased in the negative direction, the layer having a higher coercivity switches directions, as depicted in the lower left quadrant. This switching occurs when the field magnitude is equal to the coercivity of the higher-coercivity layer less the value of the exchange coupling. Thus, switching is carried out in such films in a two-step process.

Figure 2:
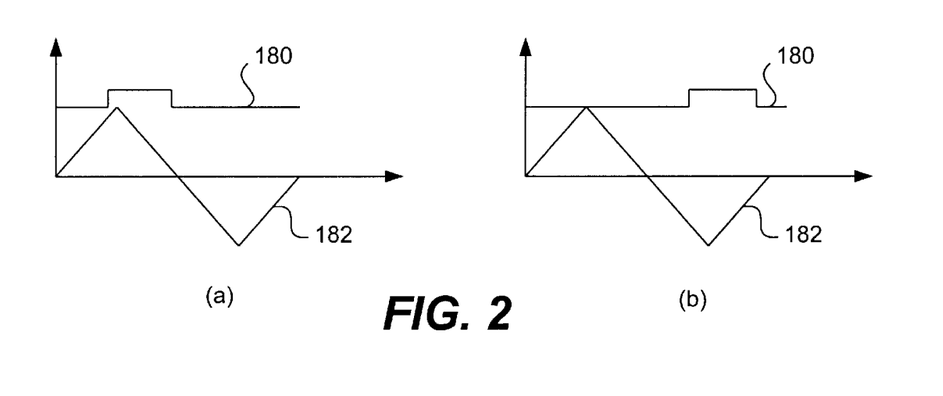

Readout of the memory cell of FIG. 1 is achieved in a nondestructive fashion by measuring the resistance change in response to the change in the magnetization obtained by applying a field from one of the word lines. The application of the field temporarily switches the lower-coercivity layer. In this example, in which exchange bias exceeds the coercivity of the lower-coercivity layer, this layer resets or switches back when the current in the word line is discontinued. FIGS. 2a and 2b depict the resistive signals 180 when a triangular word current 182 is applied. FIG. 2a shows the signal corresponding to a "zero" state and FIG. 2b shows the signal corresponding to a "one" state.

In addition to obvious advantages relating to persistence and reliability, memories based on GMR technology have achieved densities comparable to and exceeding that of conventional semiconductor memories. However, it is desirable to achieve still higher densities.

SUMMARY OF THE INVENTION

According to the present invention, techniques are provided by which individual GMR memory cells are configured to store multiple bits of information. That is, the present invention provides a multi-layered memory cell having a plurality of magnetic layers, each of the magnetic layers being for magnetically storing one bit of information. A plurality of access lines are integrated with the plurality of magnetic layers and configured such that the bits of information stored in each of selected ones of the magnetic layers may be independently accessed using selected ones of the plurality of access lines and the giant magnetoresistive effect. The memory cell further includes at least one keeper layer. The storage layers, the access lines, and the at least one keeper layer form a substantially closed flux structure.

A further understanding of the nature and advantages of the present invention may be realized by reference to the remaining portions of the specification and the drawings.

DETAILED DESCRIPTION OF SPECIFIC EMBODIMENTS

The specific embodiments of the present invention provide techniques by which the information storage density of magnetoresistive memory cells may be increased. As will be described, various approaches to achieving this increase may be taken without departing from the scope of the present invention. For example, according to one embodiment, the storage element of FIG. 1 may be used to store two bits of information rather than one. That is, it will be understood with reference to the description of the operation of the memory cell of FIG. 1 that the storage capacity of the cell is underutilized, i.e., two layers are used to store one bit of information. Therefore, the present invention provides a technique by which both layers of such a memory cell may be used for storage, thus doubling the storage capacity of memory devices employing such cells.

In addition, and as mentioned above, some of the magnetic layers in the various embodiments of the invention may be used for storage, some for readout, some for both storage and readout, and others as keepers. That is, it should be noted that even the readout layers may store information briefly for part of a read-cycle time. Therefore, to distinguish the keeper layers from those layers that store information, whether for only part of a cycle or after completion of a cycle, we shall hereinafter refer to all but the keeper (and insulator) layers as "storage layers." Use of this term is for purposes of consistency and should not be used to limit the scope of the present invention. A specific embodiment of a technique by which the storage capacity of a memory cell such as the one shown in FIG. 1 will now be described with reference to FIGS. 3 and 4.

Figure 3:
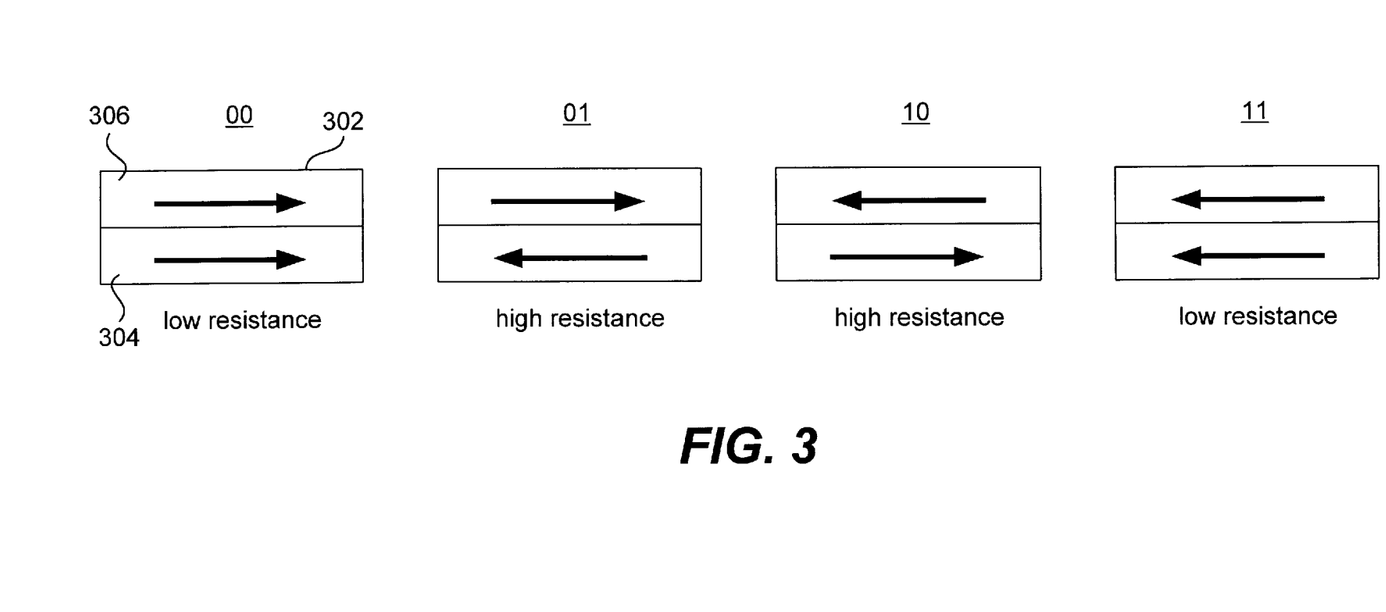
FIG. 3 shows the magnetization states of a dibit GMR memory cell.

FIG. 3 shows four magnetization states of a memory cell 302 having a low coercivity storage layer 304 and a high coercivity storage layer 306. As indicated in the figure, each of the states represents a unique two-bit combination. That is, the state "00" is shown as both storage layers being magnetized to the right while the state "11" is shown as both layers being magnetized to the left. Because the magnetization vectors in this states are parallel, they exhibit relatively low resistance. By contrast, the states "01" and "10" are both characterized by the magnetization vectors oriented in opposite directions, i.e., a relatively high resistance state as compared to the parallel vectors due to the GMR effect.

Those of skill in the art will understand how each of the states may be written to memory cell 302. That is, layer 306 is magnetized first by the application of a magnetic field which overcomes the layer's coercivity. Because of its lower coercivity, layer 304 is also magnetized in the same direction, at least initially. The antiparallel state of layer 304 may then be written by application of a second magnetic field of the opposite orientation which is sufficient to overcome the coercivity of layer 304 but not layer 306.

Figure 4:
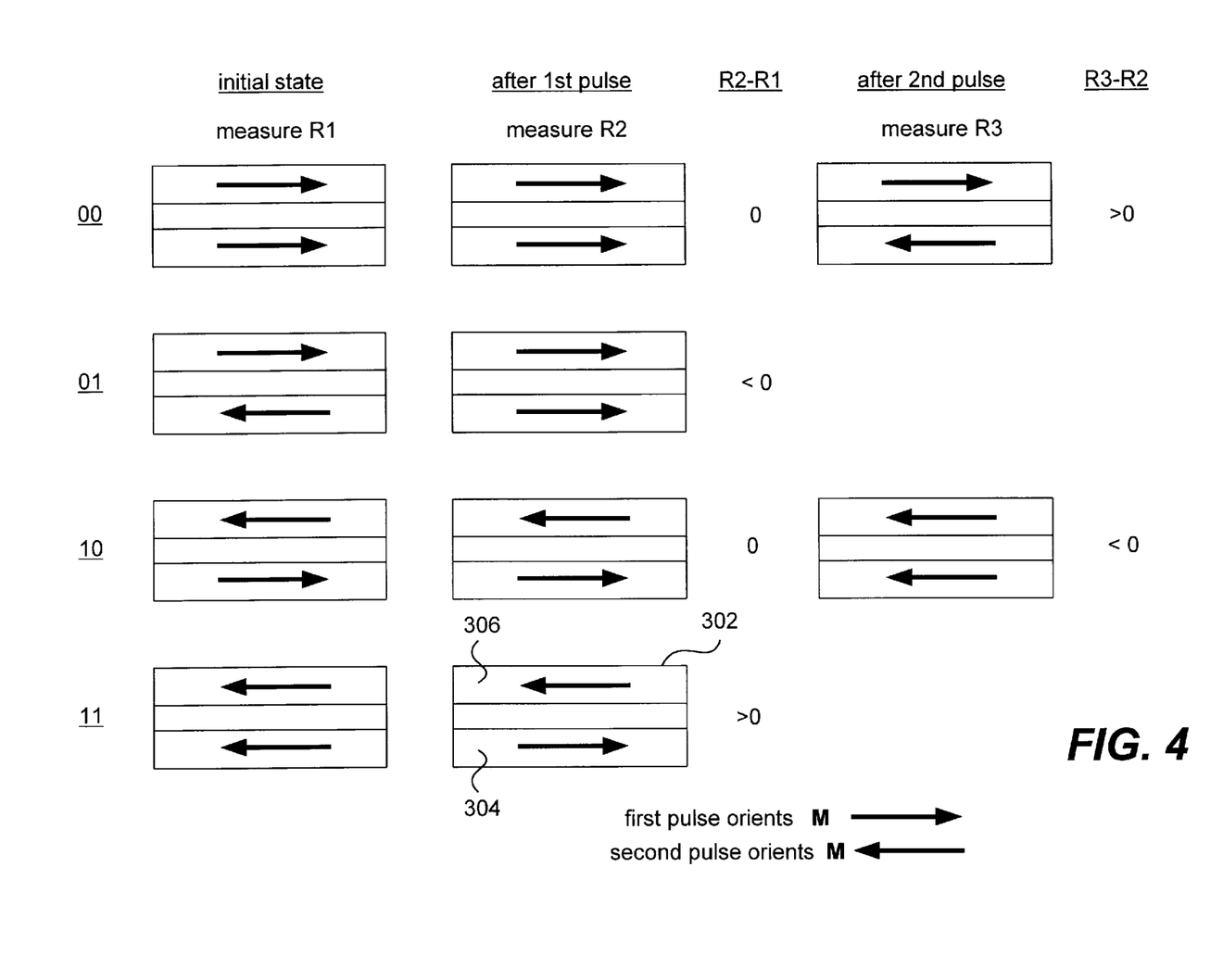
FIG. 4 illustrates operation of a GMR memory cell according to a specific embodiment of the present invention.

The reading of the information stored in memory cell 302 will now be described with reference to FIG. 4. As will be described, the readout process may vary depending upon the initial state of the cell. Initially, a resistance value R1 associated with the multi-layer cell is measured while the cell is in an initial state (column 1). A magnetic field is then applied which is sufficient to overcome the coercivity of layer 304 and magnetize layer 304 in a particular direction, e.g., to the right as shown. A resistance value R2 is then measured after the application of the magnetic field (column 2), and the difference between R1 and R2 determined (column 3). In the example shown, if R2–R1 is less than zero, then the initial state of the cell is determined to be the "01" state. Similarly, if R2–R1 is greater than zero, the initial state corresponds to the "11" state. The initial state is then rewritten to the cell.

If, on the other hand, there is no difference between R1 and R2, the initial state could have been either "00" or "10". If all that is desired is to determine the state of the low coercivity layer 304, i.e., "0" in both instances, no further action need be taken. However, if the state of layer 306 must be determined, a second magnetic field may be applied in the direction opposite to the first magnetic field to reverse the magnetization in layer 304, e.g., to the left in this example, and a third resistance value R3 measured (column 4). If R3–R2 is greater than zero, the initial state is determined to be "00"; if less than 0, the initial state is determined to be "10" (column 5). The initial state is then rewritten to the cell.

Although specific embodiments of the invention (such as the one described above with reference to FIG. 4) refer to layers having different coercivities (e.g., layers 304 and 306), it should be noted that other embodiments of the invention employ layers having the same coercivities, relying on alternative mechanisms to effect storage and readout. An example of such a mechanism is the use of localized fields to switch one layer without switching a nearby layer having the same coercivity. Examples of such embodiments are described below.

According to various other embodiments of the present invention, memory cell designs are provided in which multiple bits of information may be stored. Specific embodiments will be described below in which 2, 3, or 4 bits of information may be stored and which employ either destructive readout (DRO) or nondestructive readout (NDRO). It will be understood, however, that particular ones of these designs may be generalized to store more bits of information than described. For example, it will be understood with reference to specific ones of the embodiments described that an NDRO configuration may also be used as a DRO configuration in which up to twice as many bits of information are stored in the same structure.

Three embodiments which employ DRO will now be described with reference to FIGS. 5 and 6. Each of the described embodiments employs cobalt storage layers, copper access lines, and a double keeper. However, it will be understood that a variety of materials may be employed for various ones of these elements without departing from the scope of the invention.

Figure 5:
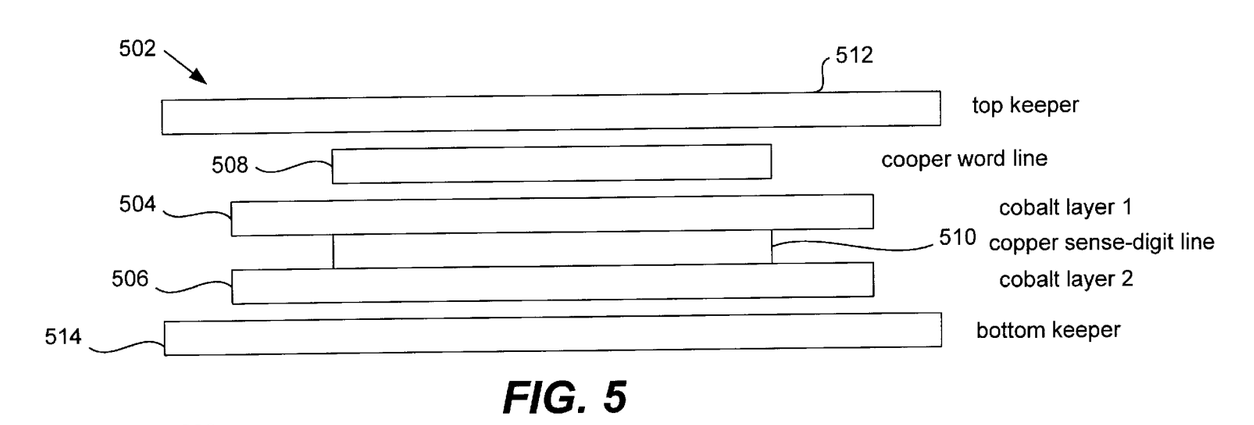
FIG. 5 shows a dibit memory cell designed according to a specific embodiment of the invention.

FIG. 5 shows a memory cell 502 configured to store two bits of information. Cobalt layers 504 and 506 are provided in which the individual bits of information are to be stored as represented by the magnetization vector associated with each. According to a specific embodiment, the coercivities of layers 504 and 506 are substantially equal. A copper word line 508 and a combined copper sense-digit line 510 are provided to provide read and write access to cell 502. Top and bottom keepers 512 and 514 are provided to ensure that memory cell 502 is a substantially closed flux structure. Such a double keeper configuration greatly reduces any demagnetizing field from a magnetic film but does not impede the field from a strip line.

It should be noted that insulation layers are represented by the blank spaces between the layers shown. These layers were omitted for purpose of clarity. In addition, the various layers are shown having different widths for illustrative purposes. However, the layers of actual embodiments are typically the same width. Finally, it will be understood that the vertical dimension of the figures of the application are often exaggerated for illustrative purposes.

A memory module based on the memory cell of FIG. 5 is similar to a memory module based on the single-bit memory cell of U.S. Pat. No. 5,587,943 incorporated by reference above. That is, such a memory module has word lines oriented in the x-direction and sense-digit lines oriented in the y-direction. Selection matrices are provided for selecting the word and sense-digit lines as well as low level gates and sense amps for the sense-digit lines.

One can understand how to write to the dibit memory cell 502 of FIG. 5 by application of the right hand rule. That is, when the current in word line 508 is parallel to that in sense-digit line 510 and the amplitudes are equal, the field between these lines is zero, i.e., cobalt layer 504 experiences no applied field. However, the field experienced by cobalt layer 506 is the sum of the field contributions from the two lines. Thus, cobalt layer 506 may be written using coincident currents of the same polarity in lines 508 and 510, each of which may generate a field which by itself could not overcome the coercivity of layer 506 (i.e., less than $H_c$), but which, when combined with the field from the other line is sufficient to impose a magnetization on layer 506 (i.e., greater than $H_c$).

When, on the other hand, the current in word line 508 is antiparallel to that in sense-digit line 510 and the amplitudes of the currents are substantially equal, the combined field outside of lines 508 and 510 is effectively zero while the field between the lines, i.e., the field experienced by cobalt layer 504, is doubled. Thus, cobalt layer 504 may be written using coincident currents in the word and sense-digit lines of opposite polarity, each of which may have a field less than $H_c$ but whose combined sum is greater than $H_c$.

According to a specific embodiment, the procedure for reading dibit memory cell 502 involves several steps. Initially, the resistance of sense-digit line 510 is measured. A known logic state, e.g., a "1", is then written to cobalt layer 504 with coincident currents in access lines 508 and 510 as described above. The resistance of sense-digit line 510 is then measured again. If it has changed, it is determined that the initial state of layer 504, i.e., the bit of information originally stored in layer 504, is different than the current state, e.g., if the layer was written as a "1" it must have previously been a "0". If the resistance has not changed, the opposite conclusion is established, i.e., that the bit of information originally stored in layer 504 is the same as the current state.

The state of layer 506 may subsequently be determined by switching the state of layer 506 and comparing the resulting resistance to the last resistance measurement. The state of layer 506 may then be determined from whether the resistance increases or decreases. For example, if the bottom layer is switched from a "1" to a "0" and the resistance decreases, the top layer must be a "0", i.e., the magnetization vectors of the two layers are now aligned. By contrast, if in such a scenario the resistance increased after such a switch, the top layer must be a "1", i.e., the magnetization vectors of the two layers are now antiparallel. After a read operation, the original states of layers 504 and 506 may be rewritten as required.

Of course, it will be understood that a read operation may be performed to determine the state of both of the storage layers as described above, or to determine the state of either of the layers separately.

It will be understood that variations on the structure of memory cell 502 may be made without departing from the scope of the present invention. For example, the respective coercivities or compositions of storage layers 504 and 506 may be varied. According to specific embodiments, permalloy is an attractive choice because it lowers drive current requirements. In addition, the current amplitudes of the current used to access memory cell 502 need not necessarily be equal to enable operation according to the principles of the present invention.

Figure 6:
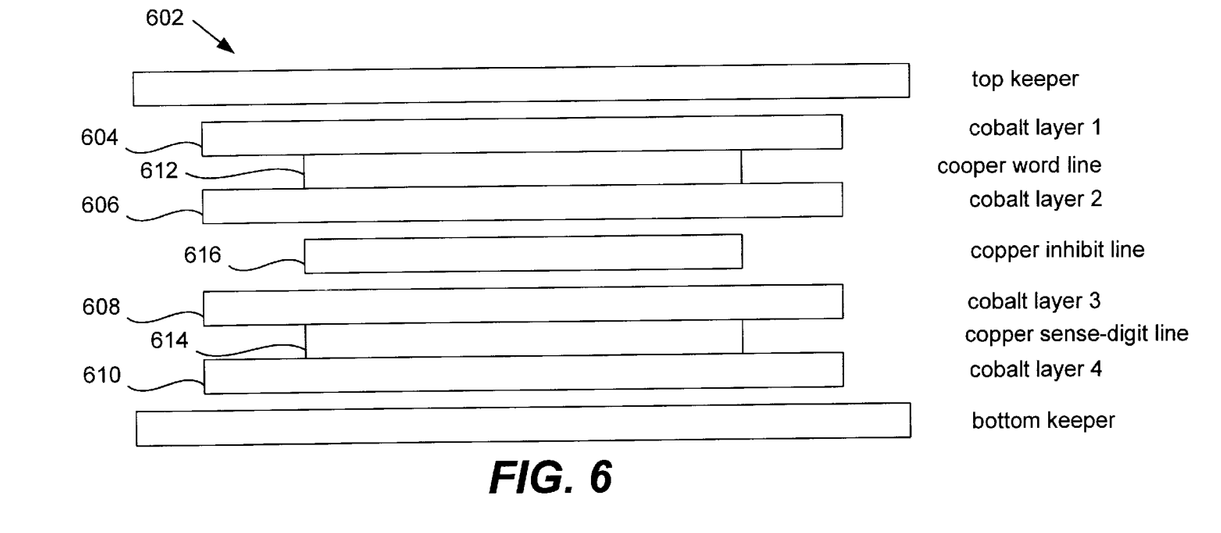
FIG. 6 shows a triple or quad bit memory cell designed according to another specific embodiment of the invention.

FIG. 6 shows a memory cell 602 which may be configured according to various specific embodiments to store three or four bits of information. As with memory cell 502 of FIG. 5, insulating layers in the gaps between layers are not shown and the vertical dimension is exaggerated for clarity. In addition, in an actual embodiment, the layers and access lines would likely be the same width but are differentiated here for illustrative purposes.

Memory cell 602 has four cobalt storage layers 604, 606, 608 and 610 each of which is capable of storing one-bit of information. The cell access lines include a copper word line 612, a copper sense-digit line 614, and a copper inhibit line 616. The term "inhibit line" is used in reference to the inhibit line of the old ferrite core memories which employed three wires per cell and was used to increase margins. The inhibit line of the present invention is used to break the symmetry. According to a specific embodiment, the inhibit line of the present invention links (goes over) all of the bits in an array. According to another embodiment, the inhibit line does not link all bits in the array. Rather they are configured to run diagonally through the array and are furnished with their own selection matrix.

As will become apparent, in three-bit embodiments, the magnetization states of storage layers 604 and 610 (and thus the information stored therein) are not independent. That is, each is magnetized in the opposite direction of the other. According to other embodiments (discussed below), this symmetry can be broken using a variety of techniques such that each of the four storage layers may be written and read independently.

According to the three bit embodiment, the storage layers of memory cell 602 are characterized by substantially equal coercivities and may be written by the application of different combinations of coincident currents in the three access lines. The fields generated as a result of the applied currents are given by:

$$H_1 = k\{-I_w - I_i - I_d\} \quad (1)$$

$$H_2 = k\{I_w - I_i - I_d\} \quad (2)$$

$$H_3 = k\{I_w + I_i - I_d\} \quad (3)$$

$$H_4 = k\{I_w + I_i + I_d\} \quad (4)$$

where $I_w$, $I_i$, and $I_d$ correspond to the currents in the word, inhibit, and sense-digit lines, respectively, $H_1$–$H_4$ are the fields in layer 604–610, respectively, and k is a constant of proportionality inversely proportional to the line width and equal to 6 Oe per ma for a 1 micron width.

From these equations, it can be seen that layers 606 and 608 may each be switched with a current pulse combination that will not switch any other layer in the cell. For example, if $I_w = +H_c/3k$ and $I_i = I_d = -H_c/3k$, then the field at layer 606 is $H_c$, while the field at layers 604 and 608 is $H_c/3$ and the field at layer 610 is $-H_c/3$. That is, there is a three-to-one ratio between the field at the desired storage layer and each of the other storage layers. It can also be seen, however, that in this particular embodiment where the coercivities of layers 604 and 610 are substantially equal, these layers do not switch independently. That is, a field combination that switches one of these two layers will switch the other in the opposite direction. Thus, in such an embodiment where layers 604 and 610 are interdependent in this way, only three bits of information may be stored in or retrieved from memory cell 602.

To effect reading of the information in three-bit memory cell 602, the control electronics for word line 612 and sense-digit line 614 are the same. That is, low level gates and pre-amps are situated at the ends of each making the word lines, in effect, word-sense lines. The reading of an individual cobalt storage layer is achieved in much the same way as described above with regard to dibit memory cell 502. That is, the resistance of the access line to which the storage layer of interest is attached is measured. A known logic state is then written to the storage layer of interest and the resistance of the associated access line measured again. If the resistance changes, the storage layer was originally in the opposite state of the logic state that was just written. If the resistance does not change, then the current logic state is the same as the original logic state. Also as described above with reference to dibit memory cell 502, the state of the other storage layer associated with the same access line may be determined by switching the first layer again and determining whether the resistance goes up or down.

According to various specific embodiments, memory cell 602 is modified such that all four storage layers may be used to store independent bits of information. That is, memory cell 602 has enough storage layers to store four bits of information. However, as discussed above, if the coercivities of the layers are substantially equal, any current pulse sequence which writes storage layer 604 to a particular logic state will also write storage layer 610 to the opposite state.

According to a first embodiment, memory cell 602 becomes a four-bit memory cell with the addition of another access line to break the symmetry which results in the interdependency of layers 604 and 610. This embodiment requires an additional masking level and an additional selection matrix to control the added access lines which, in a specific embodiment are positioned below the top keeper.

According to a second embodiment, the compositions of storage layers 604 and 610 are made sufficiently different such that their switching thresholds require different field strengths for switching. This may be accomplished, for example, by depositing a permalloy layer directly over cobalt storage layer 604. This will give layer 604 a lower coercivity than layer 610. Thus, when coincident currents are applied to the access lines, the resulting fields will write layer 604 before writing layer 610.

According to a third embodiment, the separation spacing between the keepers and the cobalt storage layers is adjusted such that demagnetizing fields become significant enough to break the symmetry. This embodiment takes advantage of the fact that even a perfect keeper doesn't completely cancel the demagnetizing field of a finite size magnetic layer spaced a nonzero distance from the keeper. Such a demagnetizing field is proportional to the distance between the magnetic field and the keeper. This demagnetizing field can be used to break the symmetry and allow both layer 604 and layer 610 to be written to the same state. For example, if one wishes to write a "0" to both layers 604 and 610, a pulse combination may first be applied which writes a "1" to layer 604 and a "0" to layer 610. A "1" is then written into each of layers 606 and 608. This results in a demagnetizing field which tends to bias layers 604 and 610 toward the "0" state. Thus, when a subsequent pulse combination is applied which tends to write layer 604 in the "0" state and layer 610 in the "1" state, only layer 610 is switched. This leaves both layers 604 and 610 in the same state, e.g., "0". Layers 606 and 608 may then be written independently.

The four-bit embodiment of memory cell 602 may be read in much the same way as the three-bit embodiment described above. According to a specific embodiment, this may be done by switching only the interior bits (i.e., layers 606 and 608) and using the read procedure described with reference to the dibit memory cell 502 of FIG. 5.

Figure 7:
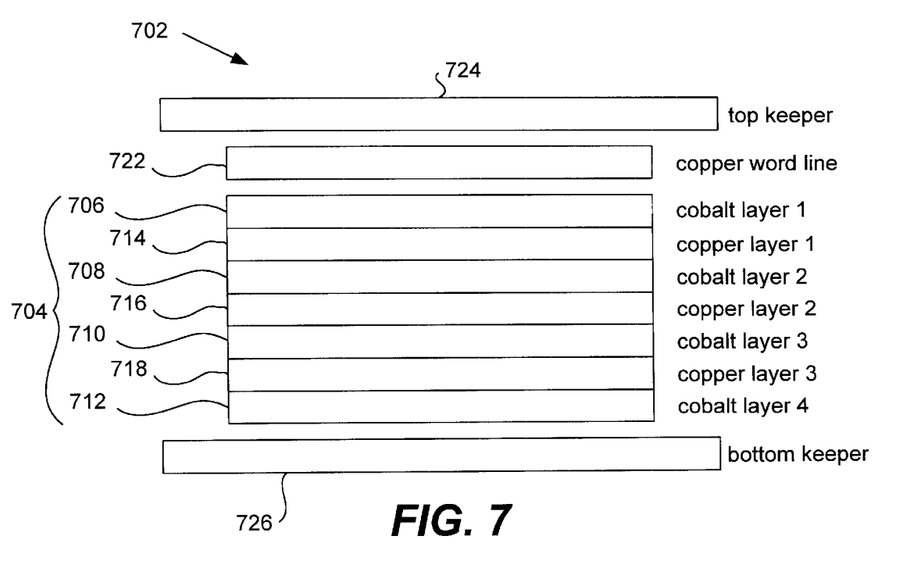
FIG. 7 shows a dibit memory cell designed according to yet another specific embodiment.

According to further specific embodiments of the present invention, multi-layer memory cells are stacked to achieve increased information storage density. A double-density stacked memory cell 702 designed according to one such embodiment is shown in FIG. 7. Memory cell 702 includes a GMR film structure 704 which functions as the sense-digit line of the cell. According to the specific embodiment shown, structure 704 is a multi-layer GMR structure having four cobalt layers 706, 708, 710, and 712, separated by three copper layers 714, 716, and 718. The cell also includes a copper word line 722 and top and bottom keepers 724 and 726. The purpose of the double keeper is to cancel the demagnetizing fields from the magnetic layers while not impeding the fields from the access lines. For illustrative purposes, insulating layers located in the blank spaces between noncontiguous layers are not shown and the vertical dimension of the cell is exaggerated.

The reading and writing of memory cell 702 will now be described with reference to the FIGS. 8a and 8b which show the resulting magnetic fields from opposing currents in multi-layer GMR structure 704. Current flowing out of the page through GMR structure 704 generates a magnetic field 802 as shown in FIG. 8a. The field is oriented to the left in the top two cobalt storage layers 706 and 708 and to the right in the bottom two cobalt storage layers 710 and 712. As will be understood, magnetic field 802 is stronger at layers 706 and 712, weaker at layers 708 and 710, and zero at the center of the structure.

In FIG. 8b, the direction of the current is reversed, i.e., into the page, and reduced in magnitude such that the coercivities of the inner layers 708 and 710 are not overcome by magnetic field 804. This results in the switching of layers 706 and 712 but not layers 708 and 710 as shown. The result is that each cobalt layer is magnetized antiparallel to its neighbor(s), a configuration which yields the highest magnetoresistance of sense-digit line 704.

Figure 8:
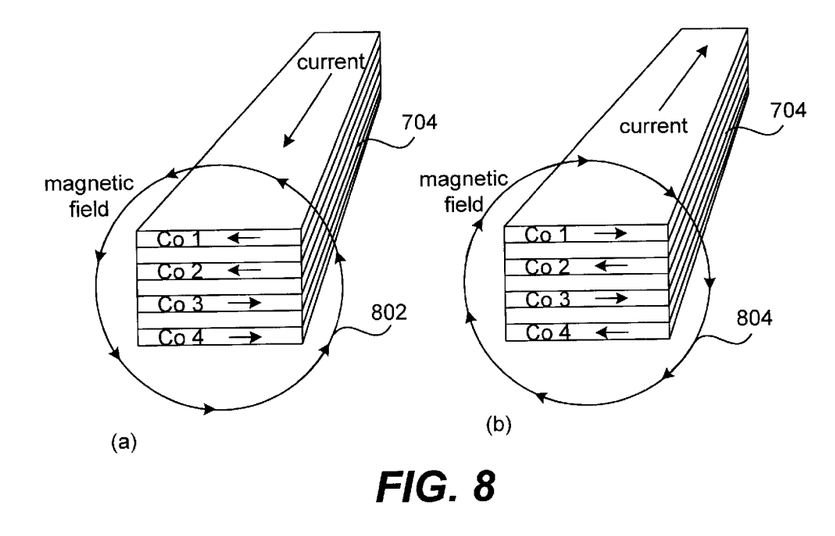
FIG. 8 shows the relationship between magnetic fields and current in a GMR thin film structure.

Because the conductivity of copper is much larger than that of cobalt, the approximation that all of the current in sense-digit line 704 is carried by the copper layers may be made. Using this approximation, it can be seen that the magnitudes of the fields in layers 706 and 712 are approximately three times the magnitudes of the fields in layers 708 and 710. For example, the field experienced by cobalt layer 708 from copper layer 714 is cancelled by the field from copper layer 716, leaving only the field component from copper layer 718. By contrast, cobalt layer 706 experiences positive field contributions from each of the copper layers. This difference in field magnitude is the basis for operating the stacked memory cells of the present invention.

The writing of the dibit memory cell 702 according to a specific embodiment of the invention will now be described with reference to FIGS. 7 and 8. According to this embodiment, the two inner cobalt layers 708 and 710 are used to store the information, and the two outside cobalt layers 706 and 712 are used to read out the information nondestructively, i.e., NDRO. The memory cell is written with a coincidence of currents in word line 722 and sense-digit line/GMR structure 704. Because, as discussed above, a current in sense-digit line 704 results in a much larger field at the outer cobalt layers than at the inner cobalt layers, it is possible to switch the outer layers without disturbing the inner ones.

A current in sense-digit line 704 will result in a magnetic field in cobalt layer 708 which is equal and opposite to the field experienced by cobalt layer 710. When a coincident current is applied to word line 722, the resulting field will add to the field in one of layers 708 and 710 and subtract from the other. This makes it possible to write to either one of layers 708 or 710 without disturbing the other. So, for example, to write to layer 710, a current which produces a field of magnitude $H_c/2$ at layer 710 is applied to sense-digit line 704 in the direction out of the page (see FIG. 8). A current one-third as large is coincidentally applied to word line 722 in the same direction resulting in another field of magnitude $H_c/2$ at layer 710. The combined field has a magnitude $H_c$ which is sufficient to switch layer 710. However, because the first field contribution at layer 708 is $-H_c/2$, the two field's cancel and layer 708 does not switch.

To read the information stored in dibit memory cell 702 the magnitude of the read current in sense-digit line is ⅓ of that of the write current. This results in a field of $H_c/2$ at layer 706 and $-H_c/2$ at layer 712. The resulting fields at layers 708 and 710 are of magnitude $H_c/6$ and will therefore not cause any switching of these layers. To read the information in layer 708, layer 706 is written, i.e., magnetized, in a first direction and the resistance of sense-digit line 704 is measured. Layer 706 is then written in the other direction and the resistance measured again. The two resistance measurements are then compared. The resistance will be lower when layers 706 and 708 are magnetized in the same direction, and higher when they are magnetized in opposite directions. Therefore, the direction of magnetization of layer 708, i.e., the logic state stored in layer 708, may be determined from the comparison of the resistance values. The reading of layer 710 is achieved using the same procedure with layer 712.

Figure 9:
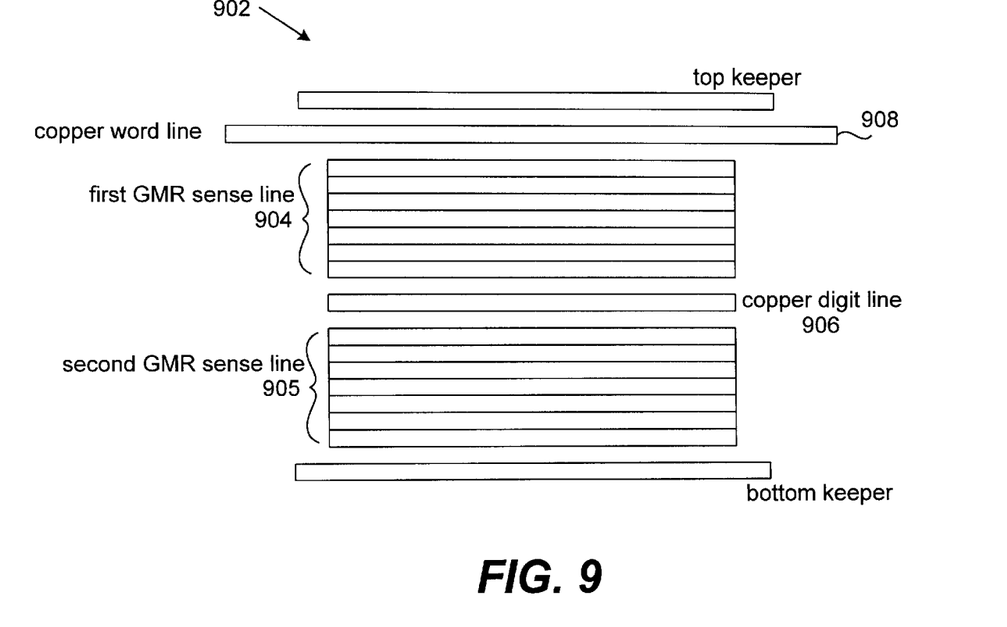
FIG. 9 shows a quad bit memory cell designed according to a further embodiment of the invention.

A quadruple-density stacked memory cell 902 designed according to another embodiment of the present invention is shown in FIG. 9. Memory cell 902 includes two GMR film structures 904 and 905 which function as sense lines of the cell. According to a specific embodiment of the invention, each of structures 904 and 905 is designed similarly to the GMR film structure 704 shown in FIGS. 7, 8a and 8b. That is, the embodiment shown in FIG. 9 stacks two of the single GMR structure of dibit memory cell 702 of FIG. 7 to effect storage of 4 bits of information.

As with dibit cell 702, the four bits of information of quadbit cell 902 are stored in the two center cobalt layers of each of sense lines 904 and 905. The fields on the top and bottom data bit layers of sense line 904 will be denoted $H_1$ and $H_2$, respectively. The fields on the top and bottom data bit layers of sense line 905 will be denoted $H_3$ and $H_4$, respectively. The term k will be used to represent the constant of proportionality between the magnetic field and current on the surface of a stripline having the width of those in the memory (k=6 Oe/ma for a line 1 micron wide, and is inversely proportional to the width of the stripline). The current in top sense line 904 will be denoted $i_1$. The current in copper digit line 906 will be denoted $i_2$. The current in bottom sense line 905 will be denoted $i_3$. Using these definitions, the four fields at the four information storage layers are given by:

$$H_1 = k(i_1/3 + i_2 + i_3) \quad (5)$$
$$H_2 = k(-i_1/3 + i_2 + i_3) \quad (6)$$
$$H_3 = k(-i_1 - i_2 + i_3/3) \quad (7)$$
$$H_4 = k(-i_1 - i_2 - i_3/3) \quad (8)$$

Quadbit cell 902 has the same control electronics for each of its two sense lines 904 and 905 as sense-digit line 704 of dibit cell 702, i.e., low level gates and preamps. From equations 5–8, it can be seen that each of the four information storage layers of quadbit cell 902 may be written independently of the others by the appropriate combination of coincident current pulses in sense lines 904 and 905, digit line 906 and word line 908.

The read and write techniques described above with reference to dibit memory cell 702 of FIG. 7 may also be used to read the information stored in the NDRO quadbit memory cell 902. So for example, a read would begin with measurement of the resistance of the sense line of which the storage layer of interest is a part. The outer layer nearest the data bit of interest is then written to a particular logic state, e.g., a "0". The resistance of the sense line containing the layers is then measured again, and the two resistance measurements are compared. If a "0" was written to the outside layer and the resistance of the sense has gone up, then the data bit of interest is a "1"; if the resistance has gone down, the data bit of interest is a "0". If there is no change in resistance between the two measurements, the outer layer nearest the data bit of interest is then written to the opposite state, i.e., a "1," and the resistance of the sense line is again measured. If the resistance goes down, the data bit of interest is a "1." If the resistance goes up, the data bit of interest is a "0."

Figure 10:
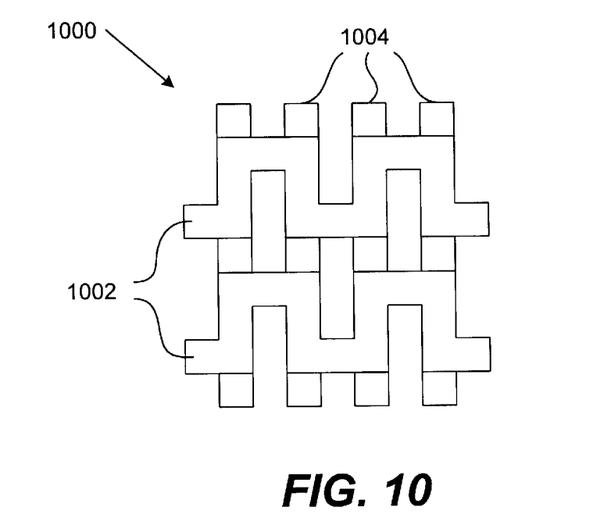
FIG. 10 is a simplified diagram of an array of memory cells designed according to the invention.

According to a specific embodiment of the present invention, various memory cells of the present invention may be configured into a memory array 1000 as shown in FIG. 10. The memory cells of the array are situated where serpentine word lines 1002 coincide with the vertical access lines 1004 which may comprise, for example, multi-layer sense-digit lines as in dibit cell 702, or separate sense and digit lines as in quadbit cell 902.

According to other embodiments, the bit density of the dibit and quadbit memory cells of the present invention may be further doubled by changing the shape of the word lines in an array 1100 of such devices and using separate sense and digit lines. This may be understood with reference to FIGS. 11a and 11b. According to such embodiments word lines 1102 are straight and orthogonal to separate sense and digit lines (1104 and 1106, respectively). FIG. 11b shows a dibit cell embodiment. However, it will be understood that the same principle may be applied to a quadbit cell embodiment.

Figure 11A:
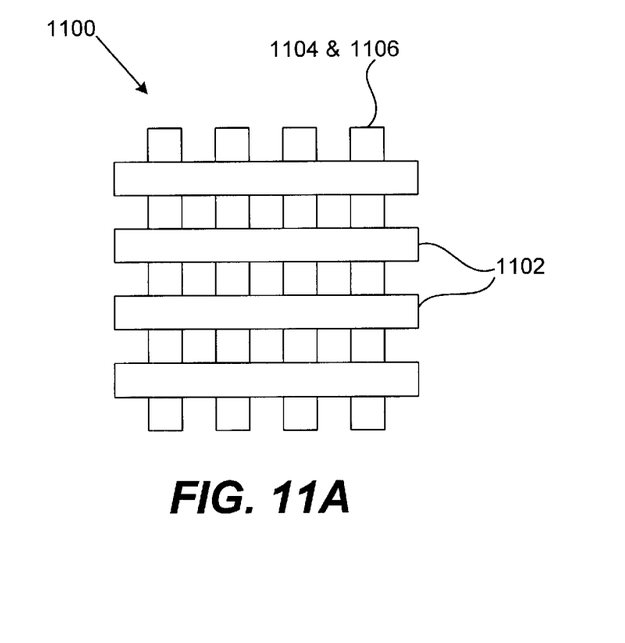
FIG. 11a is a simplified diagram of another array of memory cells according to another embodiment.
Figure 11B:
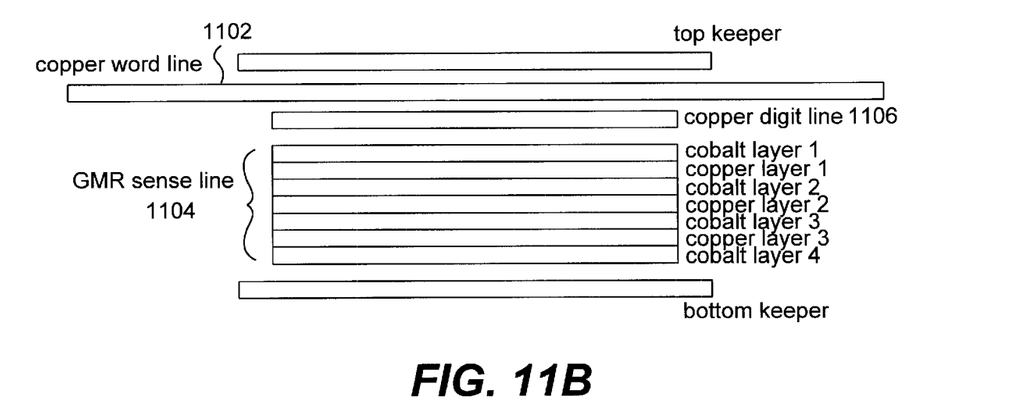
FIG. 11b shows yet another dibit memory cell designed according to the invention.

As can readily be seen by comparing the array design of FIGS. 10 and 11a, the spacing between the word lines in array 1100 is decreased by a factor of two as compared to array 1000 with an attendant twofold increase in bit density. It should be noted that there is a basic difference in the role of the word line in the design of FIG. 10 and that of FIG. 11a. In both designs, the digit line provides a half-switch field in the easy-axis direction. In the design of FIG. 10, the word line also provides an easy-axis field such that the fields contributed by the word line and the digit line are in the same direction and add arithmetically. In the design of FIG. 11a, the word line provides a hard-axis field in a direction perpendicular to the easy-axis. This has two consequences. The magnetization is rotated partially toward the hard axis, and the fields from the digit and word lines add vectorially, not arithmetically. The component of the resulting vectorially-added field along the partially rotated magnetization then provides the switching field.

While the invention has been particularly shown and described with reference to specific embodiments thereof, it will be understood by those skilled in the art that changes in the form and details of the disclosed embodiments may be made without departing from the spirit or scope of the invention. For example, several embodiments have been described herein in which the magnetic layers have been referred to as cobalt layer and nonmagnetic layers have been referred to as copper. It will be understood, however, that the cobalt layers in the specific embodiments described herein may be substituted with layers comprising other conductive magnetic alloys, e.g., permalloy without departing from the scope of the invention. Further, the nonmagnetic copper layers in several embodiments could be substituted with any of a variety of suitable nonmagnetic conductors, e.g., silver, gold, or chrome.

Moreover, since the top two magnetic layers of dibit cell 702 (706 and 708) are read out separately without disturbing the bottom two layers (710 and 712) and vice versa, it is also possible to replace the center copper layer (716) with an insulating layer such as silicon nitride or silicon dioxide. Substitution of an insulating layer may be advantageous, for example, to mitigate the effects of coupling between two magnetic films which would otherwise be separated by a metallic conducting film. Such coupling tends to align the magnetization of the two magnetic films. If a magnetic film is coupled on both sides through copper films to two magnetic neighbors, the coupling is twice as strong, making it more difficult for the middle magnetic film to act independently. Substituting an insulating film for one of the copper films decreases the coupling and thereby any negative effects associated therewith.

In addition, it should be understood that various of the memory cell structures described herein may be used for both NDRO and DRO, e.g., the structures of FIGS. 5, 7, and 9, and that memory cell structures having additional magnetic layers and storage capacity beyond those described herein are contemplated.

Reference has been made herein to the selection and control circuitry associated with the various memory cells and arrays of the present invention. This circuitry may be implemented using conventional semiconductor electronics and the well known designs of the selection and control circuits of conventional memory technology. However, it should also be understood, that such selection and control circuitry may be implemented using the all-metal GMR electronics described in U.S. Pat. No. 5,929,636 for ALL-METAL, GIANT MAGNETORESISTIVE, SOLID-STATE COMPONENT, issued on Jul. 27, 1999, the entirety of which is incorporated herein by reference for all purposes. Therefore, the scope of the invention should be determined with reference to the appended claims.

What is claimed is:

1. A multi-layered memory cell comprising:
a plurality of magnetic layers, each of at least two of the magnetic layers being for magnetically storing one bit of information;
a plurality of access lines integrated with the plurality of magnetic layers and configured such that the bits of information stored in each of selected ones of the magnetic layers may be independently accessed using selected ones of the plurality of access lines and the giant magnetoresistive effect; and
at least one keeper layer;
wherein the magnetic layers, the access lines, and the at least one keeper layer form a substantially closed flux structure.

2. The memory cell of claim 1 wherein some of the plurality of magnetic layers comprise cobalt.

3. The memory cell of claim 1 wherein some of the plurality of magnetic layers comprises permalloy.

4. The memory cell of claim 1 wherein some of the plurality of access lines comprise copper.

5. The memory cell of claim 1 wherein at least one of the plurality of access lines comprises an insulating material.

6. The memory cell of claim 5 wherein the insulating material comprises one of silicon nitride and silicon dioxide.

7. The memory cell of claim 1 wherein some of the plurality of access lines comprise multi-layer lines.

8. The memory cell of claim 1 wherein the memory cell comprises a dibit memory cell, the plurality of magnetic layers comprising two magnetic layers for storing the information.

9. The memory cell of claim 8 wherein the two magnetic layers and the plurality of access lines are configured to read the bits of information destructively.

10. The memory cell of claim 8 wherein the two magnetic layers and the plurality of access lines are configured to read the bits of information nondestructively.

11. The memory cell of claim 1 wherein the memory cell comprises a three bit memory cell, the plurality of magnetic layers comprising three magnetic layers for storing the information.

12. The memory cell of claim 11 wherein the three magnetic layers and the plurality of access lines are configured to read the bits of information destructively.

13. The memory cell of claim 11 wherein the three magnetic layers and the plurality of access lines are configured to read the bits of information nondestructively.

14. The memory cell of claim 1 wherein the memory cell comprises a four bit memory cell, the plurality of magnetic layers comprising four magnetic layers for storing the information.

15. The memory cell of claim 14 wherein the four magnetic layers and the plurality of access lines are configured to read the bits of information destructively.

16. The memory cell of claim 14 wherein the four magnetic layers and the plurality of access lines are configured to read the bits of information nondestructively.

17. The memory cell of claim 1 wherein the memory cell comprises a dibit memory cell, the plurality of magnetic layers comprises first and second magnetic layers, the plurality of access lines comprises a word line and a sense-digit line, and the at least one keeper layer comprises top and bottom keeper layers, the first and second magnetic layers and the word line and sense-digit line being configured between the top and bottom keeper layers such that parallel currents in the word line and sense-digit line result in a first magnetic field capable of switching only the first magnetic layer, and such that anti-parallel currents in the word line and sense-digit line result in a second magnetic field capable of switching only the second magnetic layer.

18. The memory cell of claim 1 wherein the memory cell comprises a three bit memory cell, the plurality of magnetic layers comprises first, second, third, and fourth magnetic layers, the plurality of access lines comprises three access lines, and the at least one keeper layer comprises top and bottom keeper layers, the magnetic layers and the access lines being configured between the top and bottom keeper layers such that different combinations of currents may be applied to the access lines such that the first, second, and third magnetic layers may be switched independently, the first and fourth magnetic layers being switched in an interdependent manner.

19. The memory cell of claim 1 wherein the memory cell comprises a four bit memory cell, the plurality of magnetic layers comprises four magnetic layers, the plurality of access lines comprises at least three access lines, and the at least one keeper layer comprises top and bottom keeper layers, the magnetic layers and the access lines being configured between the top and bottom keeper layers such that different combinations of currents may be applied to the access lines such that each of the four magnetic layers may be switched independently.

20. The memory cell of claim 19 wherein the at least three access lines comprises four access lines, one of the four access lines being for overcoming a switching interdependency of two of the magnetic layers.

21. The memory cell of claim 19 wherein switching thresholds associated with at least two of the magnetic layers are controlled to overcome a switching interdependency of the at least two of the magnetic layers.

22. The memory cell of claim 19 wherein spacings between selected ones of the keeper layers and the magnetic layers are controlled such that resulting demagnetizing fields overcome a switching interdependency of two of the magnetic layers.

23. The memory cell of claim 1 wherein the memory cell comprises a dibit memory cell, the plurality of magnetic layers comprises first, second, third, and fourth magnetic layers, and a first one of the access lines comprises a multi-layer structure exhibiting giant magnetoresistance and including at least some of the magnetic layers, the first and second magnetic layers corresponding to a first bit of information and the third and fourth magnetic layers corresponding to a second bit of information, the magnetic layers and access lines being configured such that a current in the first access line generates a magnetic field which is stronger in the first and fourth magnetic layers than in the second and third magnetic layers, respectively, information in the second and third magnetic layers being determined by switching the first and fourth magnetic layers, respectively, and taking advantage of the giant magnetoresistive effect.

24. The memory cell of claim 1 wherein the memory cell comprises a four bit memory cell, the plurality of magnetic layers comprises first, second, third, fourth, fifth, sixth, seventh, and eighth magnetic layers, and first and second ones of the access lines comprise multi-layer structures exhibiting giant magnetoresistance and including at least some of the magnetic layers, the first, second, third, and fourth magnetic layers corresponding to the first access line and first and second bits of information, the fifth, sixth, seventh, and eighth magnetic layers corresponding to the second access line and third and fourth bits of information, the magnetic layers and access lines being configured such that a current in each of the first and second access lines generates a corresponding magnetic field which is stronger in one pair of the corresponding magnetic layers than in the other pair of the corresponding magnetic layers, information in the one pair of magnetic layers being determined by switching the other pair of magnetic layers, and taking advantage of the giant magnetoresistive effect.

25. A plurality of the multi-layered memory cell of claim 1 configured in a memory array having columns and rows, each column and each row corresponding to one of the access lines, the memory array further comprising control electronics for applying currents to the access lines to effect reading and writing of individual memory cells in the memory array.

26. A method for reading the dibit memory cell of claim 17, comprising:
 reading a first resistance value associated with the sense-digit line;
 writing a logic state to the second magnetic layer;
 reading a second resistance value associated with the sense-digit line; and
 determining the bit of information associated with at least one of the first and second magnetic layers with reference to the first and second resistance values.

27. The method of claim 26 further comprising rewriting the second magnetic layer after determining the bit of information.

28. A method for writing to the dibit memory cell of claim 17, comprising applying parallel currents in the word and sense-digit line such that the first magnetic field overcomes a coercivity associated with the first magnetic layer thereby magnetizing the first magnetic layer in a first direction.

29. A method for writing to the dibit memory cell of claim 17, comprising applying antiparallel currents in the word and sense-digit line such that the second magnetic field overcomes a coercivity associated with the second magnetic layer thereby magnetizing the second magnetic layer in a first direction.

30. A method for reading the three bit memory cell of claim 18, comprising:
 reading a first resistance value associated with a first one of the access lines;
 writing a logic state to one of the magnetic layers;
 reading a second resistance value associated with the first access line; and
 determining the bit of information associated with at least one of the magnetic layers with reference to the first and second resistance values.

31. The method of claim 30 further comprising rewriting the one of the magnetic layers to which the logic state was written after determining the bit of information.

32. A method for writing to the three bit memory cell of claim 18, comprising applying a combination of currents in selected ones of the access lines to overcome a coercivity associated with only one of the magnetic layers thereby magnetizing the one of the magnetic layers in a first direction.

33. A method for reading the four bit memory cell of claim 19, comprising:

reading a first resistance value associated with a first one of the access lines;

writing a logic state to one of the magnetic layers;

reading a second resistance value associated with the first access line; and determining the bit of information associated with at least one of the magnetic layers with reference to the first and second resistance values.

34. The method of claim 33 further comprising rewriting the one of the magnetic layers to which the logic state was written after determining the bit of information.

35. A method for writing to the four bit memory cell of claim 19, comprising applying a combination of currents in selected ones of the access lines to overcome a coercivity associated with only one of the magnetic layers thereby magnetizing the one of the magnetic layers in a first direction.

36. A method for reading the dibit memory cell of claim 23, comprising:

reading a first resistance value associated with the first access line;

writing a logic state to one of the first and fourth magnetic layers;

reading a second resistance value associated with the first access line; and determining the bit of information associated with one of the second and third magnetic layers with reference to the first and second resistance values and without disturbing the bit of information so determined.

37. A method for writing to the dibit memory cell of claim 23, comprising applying parallel currents in the first access line and a second one of the access lines such that coercivities associated with the first and second magnetic layers are overcome thereby magnetizing the first and second magnetic layers in a first direction.

38. A method for writing to the dibit memory cell of claim 23, comprising applying antiparallel currents in the first access line and a second one of the access lines such that coercivities associated with the third and fourth magnetic layers are overcome thereby magnetizing the third and fourth magnetic layers in a first direction.

39. A method for reading the four bit memory cell of claim 24, comprising:

reading a first resistance value associated with the first access line;

writing a logic state to one of the first and fourth magnetic layers;

reading a second resistance value associated with the first access line; and determining the bit of information associated with one of the second and third magnetic layers with reference to the first and second resistance values and without disturbing the bit of information so determined.

40. A method for reading the four bit memory cell of claim 24, comprising:

reading a first resistance value associated with the second access line;

writing a logic state to one of the fifth and eighth magnetic layers;

reading a second resistance value associated with the second access line; and determining the bit of information associated with one of the sixth and seventh magnetic layers with reference to the first and second resistance values and without disturbing the bit of information so determined.

41. A method for writing to the four bit memory cell of claim 24, comprising applying parallel currents in the first access line and a third one of the access lines such that coercivities associated with the first and second magnetic layers are overcome thereby magnetizing the first and second magnetic layers in a first direction.

42. A method for writing to the four bit memory cell of claim 24, comprising applying antiparallel currents in the first access line and a third one of the access lines such that coercivities associated with the third and fourth magnetic layers are overcome thereby magnetizing the third and fourth magnetic layers in a first direction.

43. A method for writing to the four bit memory cell of claim 24, comprising applying parallel currents in the second access line and a third one of the access lines such that coercivities associated with the fifth and sixth magnetic layers are overcome thereby magnetizing the fifth and sixth magnetic layers in a first direction.

44. A method for writing to the four bit memory cell of claim 24, comprising applying antiparallel currents in the second access line and a third one of the access lines such that coercivities associated with the seventh and eighth magnetic layers are overcome thereby magnetizing the seventh and eighth magnetic layers in a first direction.

* * * * *